(12) United States Patent
Hwang et al.

(10) Patent No.: US 8,110,977 B2
(45) Date of Patent: Feb. 7, 2012

(54) ORGANIC LIGHT EMITTING DEVICE AND METHOD FOR MANUFACTURING THE SAME

(75) Inventors: Kwang Jo Hwang, Gyeonggi-do (KR); Jae Hee Park, Gyeongbuk (KR)

(73) Assignee: LG Display Co., Ltd., Seoul (KR)

( * ) Notice: Subject to any disclaimer, the term of this patent is extended or adjusted under 35 U.S.C. 154(b) by 1096 days.

(21) Appl. No.: 11/821,164

(22) Filed: Jun. 22, 2007

(65) Prior Publication Data

US 2008/0158108 A1  Jul. 3, 2008

(30) Foreign Application Priority Data

Dec. 27, 2006 (KR) .................. 10-2006-0134765

(51) Int. Cl.
*H01J 1/62* (2006.01)
(52) U.S. Cl. .................................................. 313/500
(58) Field of Classification Search .......... 313/500–506; 345/77
See application file for complete search history.

(56) References Cited

U.S. PATENT DOCUMENTS

| 7,009,254 B2* | 3/2006 | Nagasawa et al. | 257/355 |
| 2003/0127652 A1* | 7/2003 | Park et al. | 257/72 |
| 2005/0145855 A1* | 7/2005 | Park | 257/79 |
| 2006/0033099 A1* | 2/2006 | Chung et al. | 257/40 |
| 2006/0091399 A1* | 5/2006 | Lee | 257/72 |

* cited by examiner

*Primary Examiner* — Joseph L Williams
*Assistant Examiner* — Brenitra Lee
(74) *Attorney, Agent, or Firm* — Brinks Hofer Gilson & Lione

(57) ABSTRACT

A top emission OLED includes a driving TFT including a channel region and source and drain electrodes. A power supply, a ground line, and a light emitting diode are electrically coupled to the TFT and an auxiliary electrode is electrically coupled to the ground line and to the source electrode of the driver transistor. The auxiliary electrode resides between the light emitting diode and the channel region of the driver transistor and is configured to shield the channel region of the driver transistor from an electric field generated by the light emitting diode.

16 Claims, 11 Drawing Sheets

<RELATED ART>

ORGANIC LIGHT EMITTING DEVICE AND METHOD FOR MANUFACTURING THE SAME

PRIORITY CLAIM

This Non-provisional application claims priority under 35 U.S.C. §119(a) to Korean Patent Application No. 0134765/2006 filed Dec. 27, 2006, the subject matter of which is hereby incorporated by reference.

TECHNICAL FIELD

The present invention relates to an organic light emitting device (OLED) and a method for manufacturing the same.

DESCRIPTION OF THE RELATED ART

The OLED uses a phenomenon that an electron and a hole form an electron-hole pair in a semiconductor, or carriers are excited to a higher energy state and then fall down to a ground state, which is a stable state, and emit light. Since the OLED is a self-luminous type device as described above, it does not require a separate backlight unit unlike a liquid crystal display (LCD) device. Accordingly, the OLED can be manufactured in a lightweight, slim profile, and the OLED display has low power consumption and excellent viewing angle and contrast. Also, the OLED can be driven at a low DC voltage and has a fast response time. Also, since the OLED is in a solid state, it is resistant to impact, can be used over a wide range of temperature, and particularly, can be manufactured at low costs.

The OLED is classified into a passive matrix OLED and an active matrix OLED depending on a driving method.

Since the passive matrix OLED has a simple construction, a manufacturing method thereof is also simple, but the passive matrix OLED has high power consumption and is difficult to manufacture in a large size. Also, when the number of lines increases, an aperture ratio decreases.

On the other hand, the active matrix OLED can provide high light emitting efficiency and high image quality.

FIG. 1 is a schematic cross-sectional view of a related art OLED.

As illustrated in FIG. 1, the related art OLED 10 includes a thin film transistor array 14 on a first substrate 12, a first electrode 16 independently patterned for each pixel and an organic light emitting layer 18 on the thin film transistor array 14, a second electrode 20 formed on an entire surface of the substrate including the organic light emitting layer 18.

The light emitting layer 18 expresses red (R), green (G), and blue (B) colors. Generally, separate organic materials emitting light of R, G, and B colors are patterned for respective pixels P.

The first substrate 12 is attached to a second substrate 28 on which a moisture absorbent 22 is attached using a sealant 26, so that the OLED is completed.

The moisture absorbent 22 is designed for removing moisture that can penetrate into a capsule. The moisture absorbent 22 is fixed by etching a portion of the substrate 28, disposing the powder type moisture absorbent 22 into the etched portion, and attaching a tape 25.

The above-described OLED is a bottom emission OLED. The bottom emission OLED has stability by a sealing process and high degree of freedom in processing, but has a limited aperture ratio and thus is difficult to apply to a high resolution product.

On the other hand, in a top emission OLED, a thin film transistor is easily designed and the aperture ratio can be improved, so that the top emission OLED is advantageous with respect to product life.

In a related art top emission OLED, the first electrode 16 is used as a cathode, and the second electrode 20 is used as an anode. Since the first electrode 16 is connected to a drain electrode of a driving thin film transistor and is formed on the driving thin film transistor to improve an aperture ratio, the first electrode 16 has an influence on an output current saturation characteristic of the thin film transistor T.

Here, an output current means a current generated at a portion of a semiconductor layer that is located between a source electrode and a drain electrode depending on a voltage change of a gate electrode.

That is, a cathode connected to the drain electrode in the driving thin film transistor is formed on a channel of the driving thin film transistor. A voltage of the cathode behind the channel changes as a voltage of the drain electrode changes. When the voltage of the cathode on the channel changes, a field effect is generated in a portion of the channel that is located under the cathode, so that the current through the channel increases. Also, a field effect is generated in the channel as a voltage of the cathode changes, which may result in a continuous increase of an output current, instead of the saturation. The continuous increase of the output current may affect the display brightness, as opposed to the saturated output current which may not change the display brightness. Accordingly, a gray black point on an OLED or non-uniformity in brightness may occur, so that image quality deteriorates.

SUMMARY

In one embodiment, organic light emitting device includes a driver transistor including a channel region and source and drain electrodes. A power supply, a ground line, and a light emitting diode are electrically coupled to the driver transistor and an auxiliary electrode is electrically coupled to the ground line and to the source electrode of the driver transistor. The auxiliary electrode resides between the light emitting diode and the channel region of the driver transistor and is configured to shield the channel region of the driver transistor from an electric field generated by the light emitting diode.

In another embodiment, an organic light emitting device includes a driving transistor, a light emitting diode and an auxiliary electrode. The driving transistor includes a channel region, a source electrode and a drain electrode. The light emitting diode overlies the driving transistor and includes a first electrode, a second electrode and an organic light emitting layer. The first electrode is electrically coupled to the drain electrode and overlies the driving transistor. The organic light emitting layer overlies the first electrode. The second electrode overlies the organic light emitting layer. The auxiliary electrode is formed between the first electrode and the channel region and is electrically coupled to a ground line and the source electrode. The auxiliary electrode overlies the channel region.

In yet another embodiment, a method for forming an organic light emitting device includes forming a driving transistor, forming a light emitting diode and forming an auxiliary electrode. The driving transistor includes a gate electrode overlying a substrate, a semiconductor layer overlying the gate electrode and separated therefrom by a gate insulating layer, and a source electrode and a drain electrode overlying the semiconductor layer and defining a channel region in the semiconductor layer. The light emitting diode overlies the driving transistor. The diode includes a first electrode, an organic light emitting layer and a second electrode. The auxiliary electrode is formed between the first electrode and the channel region and is electrically coupled to a ground line and to the source electrode.

It is to be understood that both the foregoing general description and the following detailed description of the present invention are exemplary and explanatory and are intended to provide further explanation of the invention as claimed.

BRIEF DESCRIPTION OF THE DRAWING

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF EMBODIMENTS AND DRAWINGS

Reference will now be made in detail to the preferred embodiments of the present invention, examples of which are illustrated in the accompanying drawings.

Figure 1:
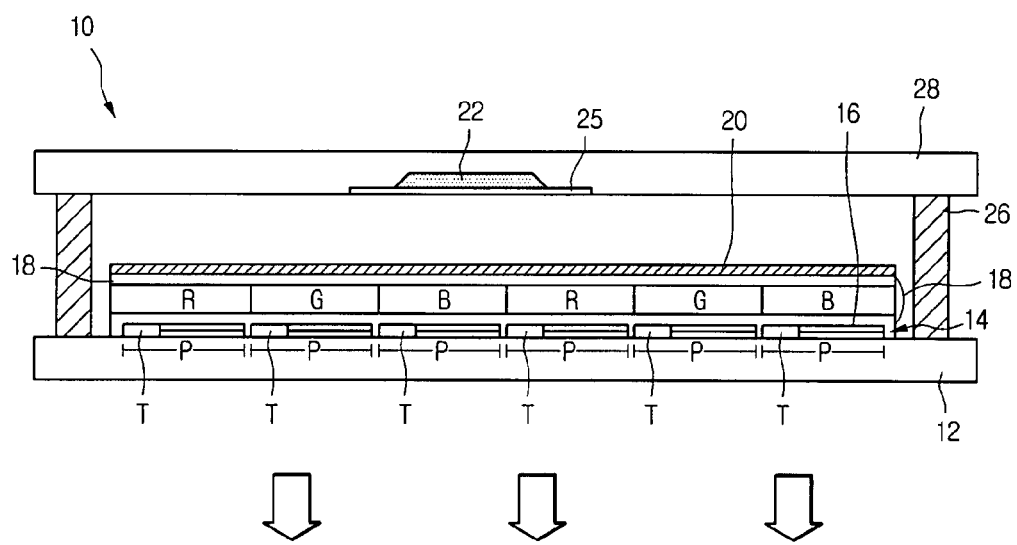
FIG. 1 is a schematic cross-sectional view of a related art OLED.
Figure 2:
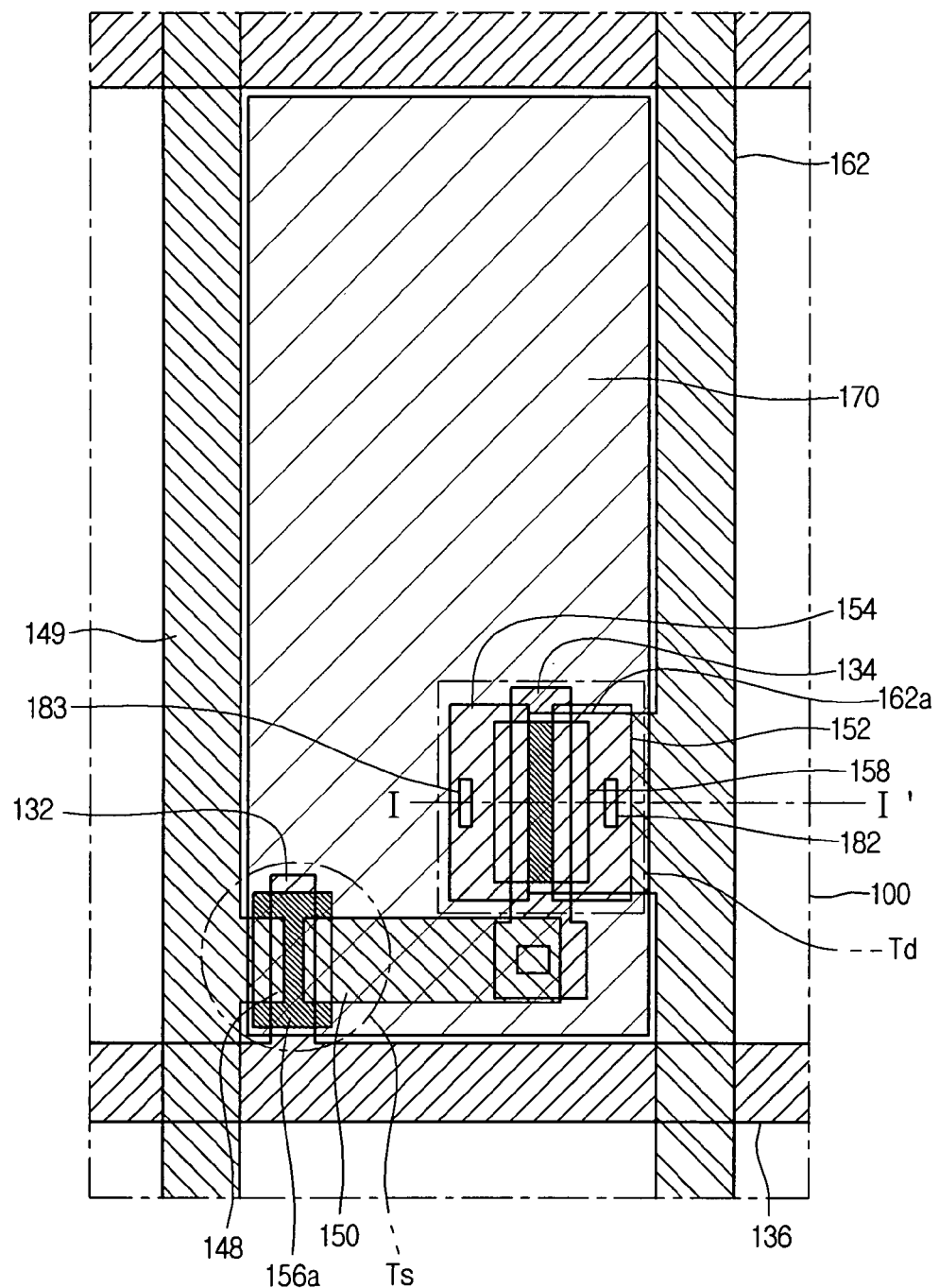
FIG. 2 is a plan view of an OLED according to a first embodiment of the present invention.
Figure 3:
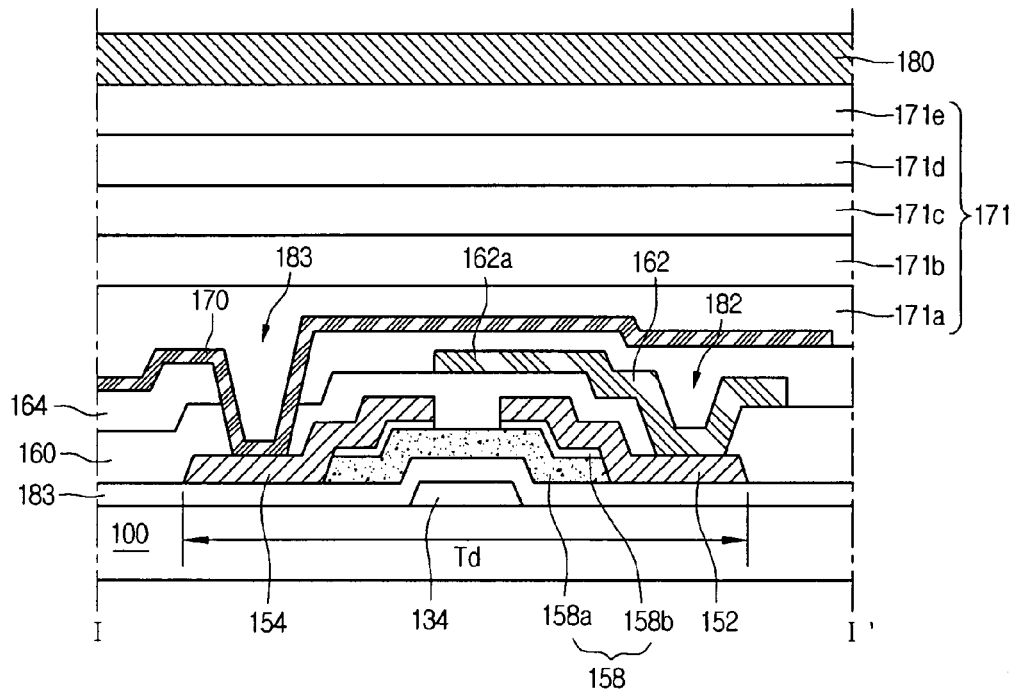
FIG. 3 is a cross-sectional view, taken along a line I-I' of FIG. 2, illustrating a portion of a driving thin film transistor in the OLED according to the first embodiment of the present invention.
Figure 4:
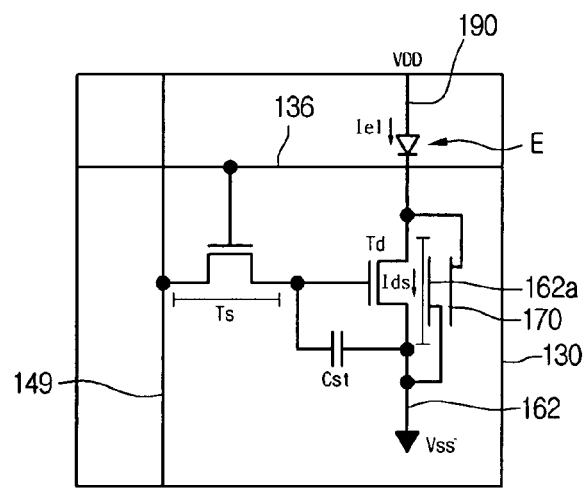
FIG. 4 is an equivalent circuit diagram of the OLED illustrated in FIGS. 2 and 3.

FIG. 2 is a plan view of an OLED according to a first embodiment of the present invention, FIG. 3 is a cross-sectional view, taken along a line I-I' of FIG. 2, illustrating a portion of a driving thin film transistor in the OLED according to the first embodiment of the present invention, and FIG. 4 is an equivalent circuit diagram of an OLED of the first embodiment.

A switching thin film transistor (TFT) and a driving TFT are formed using amorphous silicon in an OLED.

Also, an OLED according to an embodiment of the present invention is a top emission OLED where a TFT, a cathode (referred to as a first electrode hereinafter), an organic light emitting layer, and an anode (referred to as a second electrode hereinafter) are sequentially stacked.

Referring to FIGS. 2 to 4, a gate line 136 is formed in one direction of a substrate 100. A data line 149 crossing the gate line 136 to define a pixel area, and a ground line 162 separated in parallel to the data line 149 are formed.

The ground line 162 has an auxiliary electrode 162a extending toward the driving TFT.

A switching device Ts is formed at a portion where the data line 149 and the gate line 136 cross each other at right angles. The switching device Ts is connected to a driving device Td.

Here, an n-type TFT is used in the first embodiment of the present invention. The switching device Ts includes a first gate electrode 132, a first source electrode 148, a first drain electrode 150, and a first semiconductor layer 156 formed of amorphous silicon. The driving device Td includes a second gate electrode 134, a second source electrode 152, a second drain electrode 154, and a second semiconductor layer 158 formed of amorphous silicon.

The first semiconductor layer 156 includes a first active layer 156a formed of a pure amorphous silicon layer, and a first ohmic contact layer 156b formed of a doped amorphous silicon layer on the first active layer 156a.

The second semiconductor layer 158 includes a second active layer 158a formed of a pure amorphous silicon layer, and a second ohmic contact layer 158b formed of a doped amorphous silicon layer on the second active layer 158a.

The first and second ohmic contact layers 156b and 158b include n-type impurities.

The n-type impurities include at least one of P, As, Sb.

The second gate electrode 134 of the driving device Td is electrically connected to the first drain electrode 150 of the switching device Ts.

The second source electrode 152 of the driving device Td is connected to the ground line 162. The auxiliary electrode 162a may not overlap the second drain electrode 154 and cover only the second semiconductor layer 158. A first passivation layer 160 is interposed between the second drain electrode 154 and the auxiliary electrode 162a. In the case where the second drain electrode 154 is formed of metal such as Mo, a taper of the second drain electrode 154 forms an almost right angle.

At this point, the first passivation layer 160 formed on the second drain electrode 154 can be formed thin at the edge of the second drain electrode 154 by a taper characteristic of the second drain electrode 154.

However, the auxiliary electrode 162a is formed under the first electrode 170 to not only block an influence of the first electrode 170 on the channel of the second semiconductor layer 158, but also cover only the second semiconductor layer 158 and does not overlap the second drain electrode 154. The auxiliary electrode 162a may be longer or shorter than the channel upon need. Accordingly, a short circuit between the auxiliary electrode 162a and the second drain electrode 154 can be prevented.

The ground line 162 connected to the second source electrode 152 can completely cover the channel of the second semiconductor layer 158 of the driving device Td.

The second drain electrode 154 of the driving device Td is connected to the first electrode 170 located in a pixel area, and the first electrode 170 overlies the driving device Td.

The first embodiment of the present invention shows a top emission OLED, and the first electrode is formed on the driving device Td to improve an aperture ratio.

An organic light emitting layer 171 and a second electrode 180 are formed on the first electrode 170. The first and second electrodes 170 and 180 and the organic light emitting layer 171 constitute a diode E.

The organic light emitting layer 171 is formed in a single layer or a multiple layer between the first electrode 170 and the second electrode 180.

In the case where the organic light emitting layer 171 is formed in a multiple layer, an electron injection layer (EIL) can be formed to be adjacent to the first electrode 170, and a hole injection layer (HIL) can be formed to be adjacent to the second electrode 180.

For example, an EIL, an electron transport layer (ETL), an emission layer (EML), a hole transport layer (HTL), and an HIL are sequentially stacked on the first electrode 170. Also, the second electrode 180 is formed on the organic light emitting layer 171.

The organic light emitting layer 171 emits light through the following principle, in which an electron that has passed through the ETL and a hole that has passed through the HTL recombine in the EML to emit light corresponding to a lowered energy difference. Exiton is generated during this recombination, and light is emitted due to the exiton.

Also, a power line 190 connected to the second electrode 180 to apply a power voltage VDD is formed.

When the driving device Td is turned on, a current flows through the diode E and the driving device Td. When the driving device Td is turned on, a gate voltage of the driving device Td determines a current level flowing through the diode E from the power line 190. A gray scale is determined based on the current level of the diode E. Because the determined current flows the diode E, the diode E may realize a gray scale.

According to the present embodiment, a cathode having a small work function is used as the first electrode 170, and an anode having a large work function is used as the second electrode 180.

When the driving device Td is turned on, since the second source electrode 152 is connected to the ground line 162, a current Ids flows through the first electrode 170 via the second drain electrode 154, and a current Iel flows from the first electrode 170 to the organic light emitting layer.

Since the first electrode 170 is disposed on the driving device Td, and the auxiliary electrode 162a connected to the second source electrode 152 is formed between a portion of the second semiconductor layer 158 that corresponds to the driving device Td and the first electrode 170, the auxiliary electrode 162a having a source potential dominantly acts on the second semiconductor layer 158.

Since the second source electrode 152 is connected to the ground line 162, the source potential is almost 0 V.

Since the source potential does not change much even when the driving device Td is turned on, the auxiliary electrode 162a is formed under the first electrode 170 to shield an influence of the first electrode 170 on the channel of the second semiconductor layer 158.

That is, since the second source electrode 152 is connected to the auxiliary electrode 162a, a source potential is formed on the second semiconductor layer 158 to block an external field generated by the first electrode 170.

Even when the driving device Td is turned on, the source potential does not change much because a current flows through the ground line. Accordingly, the source potential has a small influence on the channel even when it is formed on the second semiconductor layer 158.

Therefore, a field effect of the channel of the second semiconductor layer 158 due to the first electrode 170 can be blocked by the ground line 162 and the auxiliary electrode 162a connected to the second source electrode 152.

Figure 5:
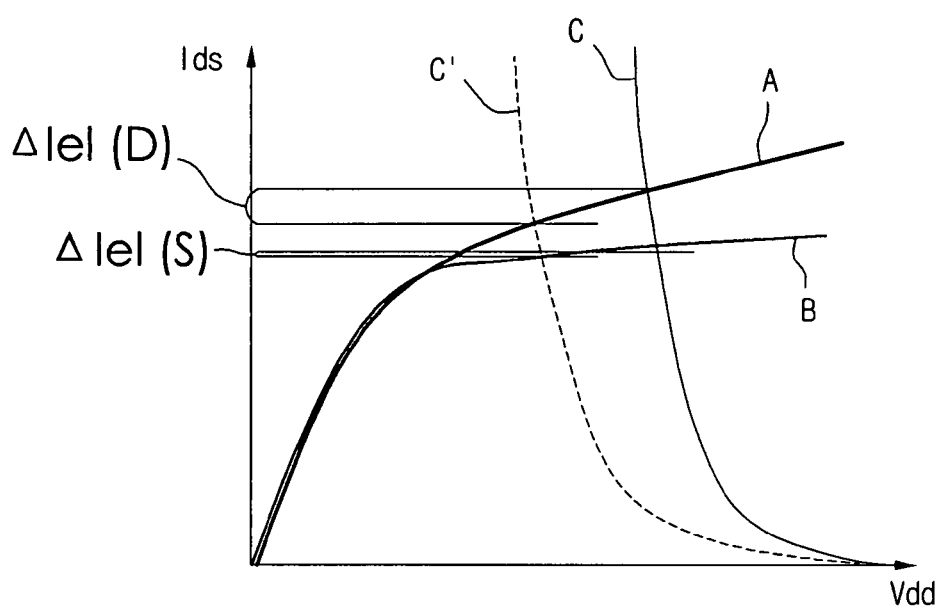
FIG. 5 is a graph illustrating a voltage-current (V-I) characteristic of a driving thin film transistor and an organic light emitting layer in an OLED according to the present invention.

FIG. 5 is a graph illustrating a voltage-current (V-I) characteristic of a driving TFT and an organic light emitting layer in an OLED according to the first embodiment.

Referring to FIG. 5, a current flows through a diode at the time at which a gate signal is applied, and a current flowing through the diode decreases after the predetermined time elapses in an OLED (time lapse is denoted as C to C').

In the prior art case where only the first electrode 170 overlies the second semiconductor layer 158 of the driving device Td, the current characteristic is shown in curve A, and an output current saturation characteristic is decreased, so that larger current reduction of ΔIel(D) is realized.

On the other hand, when the auxiliary electrode 162a at source potential through a connection to the second source electrode 152 is interposed between the second semiconductor layer 158 of the driving device Td and the first electrode 170, the auxiliary electrode 162a blocks the influence of the first electrode 170, and the current is reduced only by the amount ΔIel(S). Thus, the problem of brightness deterioration and non-uniformity are solved.

That is, a field effect in the channel of the second semiconductor layer 158 due to the first electrode 170 can be blocked by the ground line 162 and the auxiliary electrode 162a connected to the second source electrode 152.

Since the auxiliary electrode 162a disposed between the first electrode 170 and the second semiconductor layer 158 has a source potential, the source potential does not change much even when the driving device Td operates.

FIGS. 6A to 6D are cross-sectional views explaining a method for manufacturing a driving device of an OLED according to the present invention.

Figure 6A:
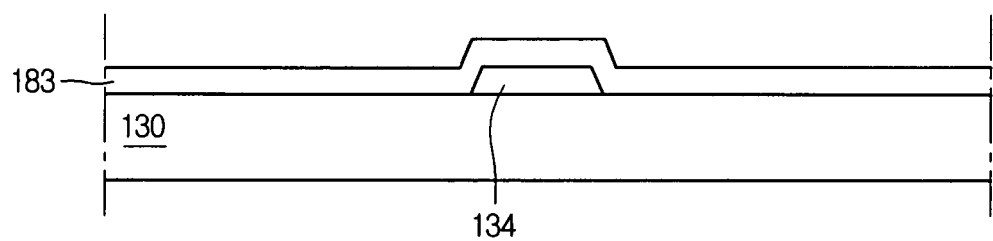
FIGS. 6A to 6D are cross-sectional views illustrating a method for manufacturing a driving device of an OLED according to an embodiment of the present invention.

Referring to FIG. 6A, a metal layer including at least one of Al, an aluminum alloy, W, Cu, Mo, and Ti is deposited and patterned on the substrate 100 to form a gate line and a second gate electrode 134.

An inorganic insulating material including $SiN_x$ and $SiO_2$ is deposited and patterned on the entire surface of the substrate 100 on which the gate line and the second gate electrode 134 to form a gate insulating layer 138, which is a first insulating layer.

Pure amorphous silicon (a-Si:H) and doped amorphous silicon (n+a-Si:H) are deposited and patterned on the gate insulating layer 138 to form a second semiconductor layer 158 in which a second active layer 158a, which is a pure amorphous silicon (a-Si:H) layer, and a second ohmic contact layer 158b, which is a doped amorphous silicon (n+a-Si:H) layer are stacked.

A metal layer including at least one of Al, an aluminum alloy, W, Cu, Mo, and Ti is deposited and patterned on the second semiconductor layer 158 to form the second source and drain electrodes 152 and 154.

The channel of the driving device Td is located on a region where the ohmic contact layer 158b has not been formed, corresponding to a region by which the second source and drain electrodes 152 and 154 are separated.

Figure 6B:
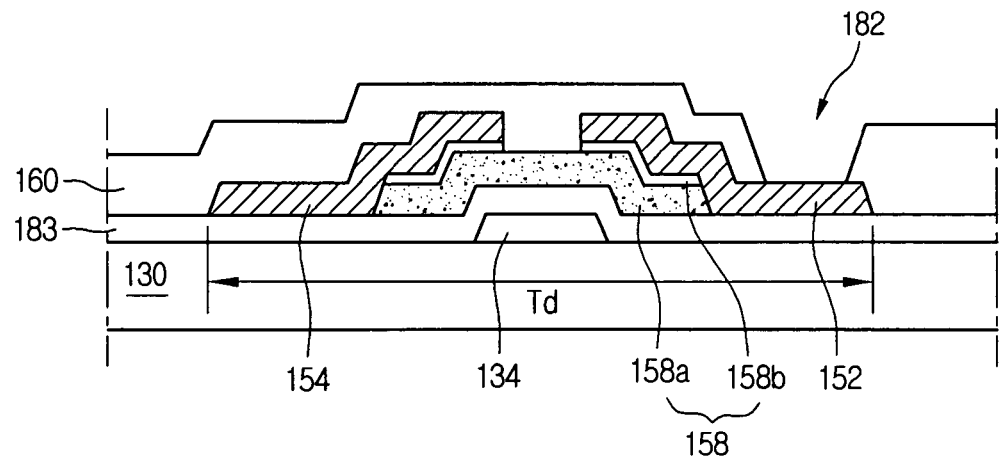

Referring to FIG. 6B, an inorganic insulating material including $SiN_x$ and $SiO_2$ or an organic insulating material including benzocyclobutene (BCB) and acryl-based resin are deposited and patterned on the entire surface of the substrate 100 including the second source and drain electrodes 152 and 154 to form the first passivation layer 160, which is a second insulating layer.

A first contact hole 182 exposing the second source electrode 152 is formed in the first passivation layer 160.

Figure 6C:
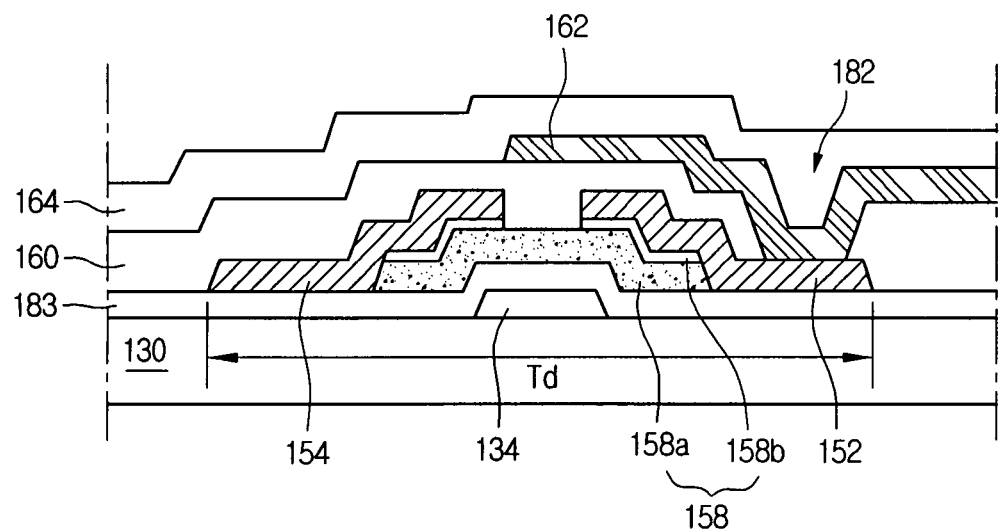

Referring to FIG. 6C, metal is deposited and patterned on the first passivation layer 160 to form the ground line 162.

The ground line 162 is connected to the second source electrode 152 via the first contact hole 182.

The ground line 162 is connected to the outside and grounded. Accordingly, the second source electrode 152 is grounded, and the ground line connected to the second source electrode 152 extends onto the channel of the driving device Td to form the auxiliary electrode 162a.

The auxiliary electrode 162a is disposed to cover only the channel of the second semiconductor layer 158 to block an influence of the first electrode 170 on the channel of the second semiconductor layer 158. Although it is preferable to cover the channel, the auxiliary electrode 162a can be extended longer or shorter than the channel upon need.

For example, the ground line 162 can completely cover the channel of the second semiconductor layer 158 of the driving device Td.

After that, an inorganic insulating material including $SiN_x$ and $SiO_2$ or an organic insulating material including benzo-cyclobutene (BCB) and acryl-based resin are deposited and patterned on the entire surface of the substrate 100 including the ground line 162 to form a second passivation layer 164, which is a third insulating layer. A second contact hole 183 exposing the second drain electrode 154 is formed in the first and second passivation layers 160 and 164.

Figure 6D:
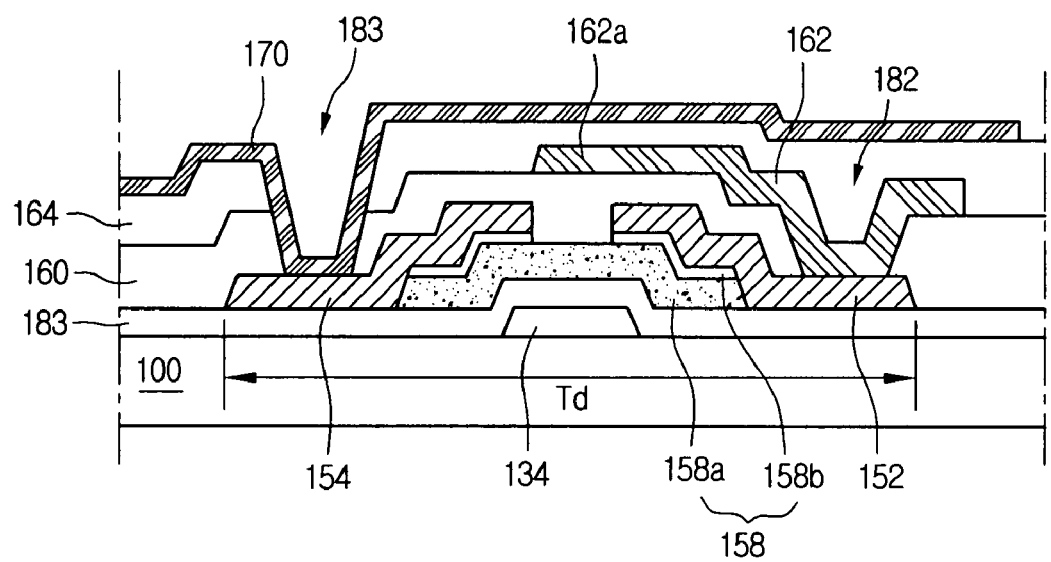

Referring to FIG. 6D, a metal layer including at least one of Al, an aluminum alloy, W, Cu, Mo, Ti, Ca, Mg, and LiF/Al is deposited and patterned on the second passivation layer 164 to form the first electrode 170.

The first electrode serves as a cathode, and may be formed of metal having a small work function, including Al, Cu, Mg, and LiF/Al.

The first electrode 170 is formed also on the driving device Td to improve an aperture ratio, and overlaps the channel of the driving device Td.

The first electrode 170 is connected to the second drain electrode 154 via the second contact hole 183.

Though not shown, an organic light emitting layer and the second electrode are formed on the first electrode 170.

The second electrode serves as an anode, and is formed of metal having a large work function, including indium-tin-oxide (ITO), and indium-zinc-oxide (IZO).

Also, the organic light emitting layer can be formed in a single layer or a multiple layer. In the case where the organic light emitting layer is formed in the multiple layer, an EIL can be formed to be adjacent to the first electrode 170, and a HIL can be formed to be adjacent to the second electrode.

Figure 7:
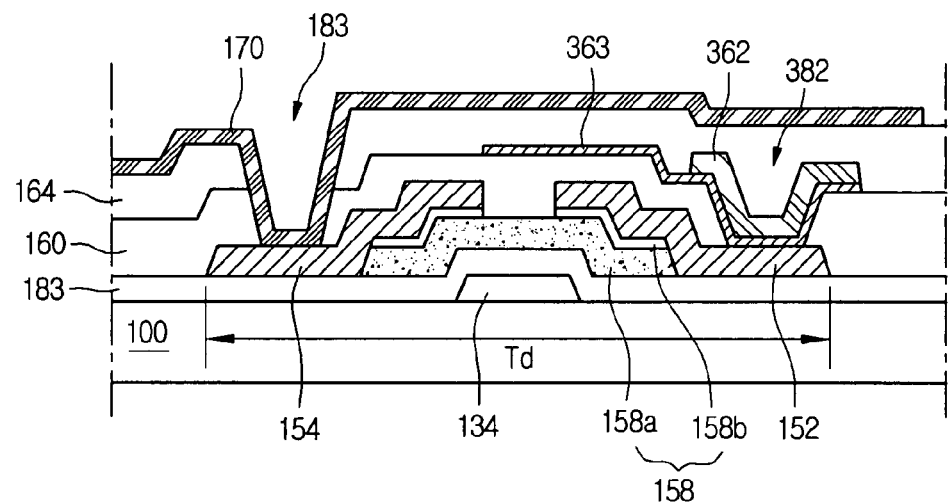
FIG. 7 is a cross-sectional view of an OLED according to a second embodiment of the present invention.
Figure 8:
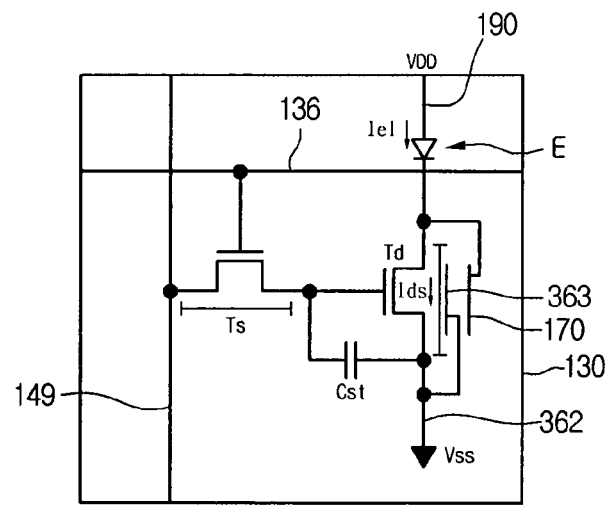
FIG. 8 is an equivalent circuit diagram of the OLED of FIG. 7.

FIG. 7 is a cross-sectional view of an OLED according to a second embodiment of the present invention, and FIG. 8 is an equivalent circuit diagram of the OLED of FIG. 8 according to the present invention.

Here, descriptions for the same parts as those described with reference to FIGS. 3 and 4 will be omitted.

Referring to FIGS. 7 and 8, an auxiliary electrode 363 is formed on a second semiconductor layer 158 of the driving device Td.

The auxiliary electrode 363 is connected to the source electrode 152, and the auxiliary electrode 363 is connected to a ground line 362.

Here, though the auxiliary electrode 363 has been disposed between the source electrode 152 and the ground line 362, the source electrode 152 and the auxiliary electrode 363 can contact each other via a first contact hole 382, and the auxiliary electrode 363 can be stacked on the ground line 362.

That is, the auxiliary electrode 362 has a source potential, and the first electrode 170 overlies the auxiliary electrode 363. The auxiliary electrode 363 can include at least one of ITO and IZO. Also, the auxiliary electrode 363 can include at least one of Al, an aluminum alloy, W, Cu, Mo, and Ti.

Figure 9:
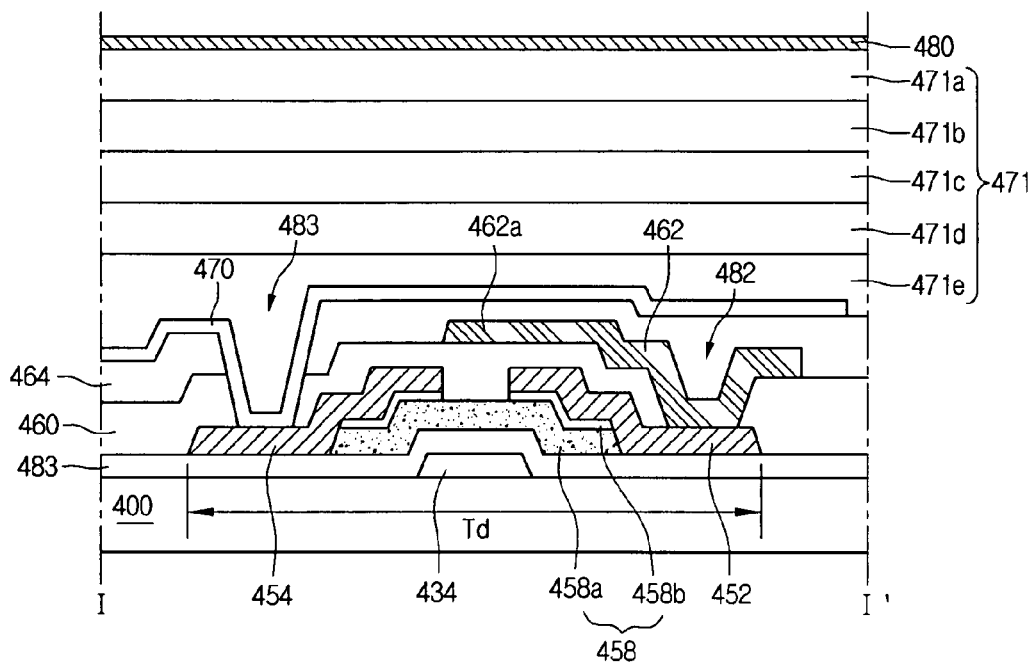
FIG. 9 is a cross-sectional view illustrating a driving thin film transistor of an OLED according to a third embodiment of the present invention.
Figure 10:
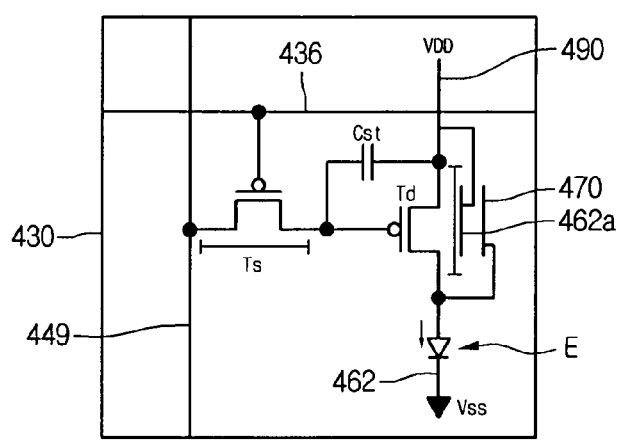
FIG. 10 is an equivalent circuit diagram of the OLED of FIG. 9.

FIG. 9 is a cross-sectional view illustrating a driving TFT of an OLED according to a third embodiment of the present invention, and FIG. 10 is an equivalent circuit diagram of the OLED of FIG. 9.

Referring to FIGS. 9 and 10, the OLED according to the present invention is a top emission OLED.

A gate line 436 is formed in one direction of a substrate 400. A data line 449 crossing the gate line 436 to define a pixel area, and a ground line 462 separated in parallel to the data line 449 are formed.

The ground line 462 is connected to an auxiliary electrode 462a formed on the driving TFT.

A switching device Ts is formed at a portion where the data line 449 and gate line 436 cross at right angles, and a driving device Td connected to the switching device Ts is formed.

According to the present embodiment, at least one of the switching device Ts and driving device Td uses a TFT having a p-type semiconductor layer.

In similarity to the switching device Ts illustrated in FIG. 2, the switching device of the present embodiment includes a first gate electrode, a first source electrode, a first drain electrode, and a first semiconductor layer formed of amorphous silicon. The driving device Td (illustrated in FIGS. 10 and 11) includes a second gate electrode 434, a second source electrode 452, a second drain electrode 454, and a second semiconductor layer 458 formed of amorphous silicon. A gate insulator 483 overlies the gate first gate electrode 434 and separates the gate electrode from the first semiconductor layer 458.

In similarity to the switching device Ts illustrated in FIG. 2, the first semiconductor layer includes a first active layer formed of a pure amorphous silicon layer, and a first ohmic contact layer formed of a doped amorphous silicon layer on the first active layer.

The second semiconductor layer 458 includes a second active layer 458a formed of a pure amorphous silicon layer, and a second ohmic contact layer 458b formed of a doped amorphous silicon layer on the second active layer 458a.

The first ohmic contact layer and second ohmic contact layer 458b include p-type impurities.

The p-type impurities include at least one of Al, B, Ga, which are tri-valent elements.

The second source electrode 452 of the driving device Td is connected to the ground line 462.

The auxiliary electrode 462a connected to the ground line 462 extends onto the driving device Td to overlap the channel of the second semiconductor layer 458.

For example, the ground line 462 connected to the second source electrode 452 can completely cover the channel of the second semiconductor layer 458 of the driving device Td.

The second drain electrode 454 of the driving device Td is connected to the first electrode 470 located in a pixel area, and a second electrode 480 is formed on the driving device Td. The first electrode 470 is connected to second drain electrode 454 through a contact opening 483 in first and second passivation layers 460 and 464.

The present embodiment shows a top emission OLED, and the first electrode 470 is formed on the driving device Td to improve an aperture ratio.

An organic light emitting layer 471 and the second electrode 480 are formed on the first electrode 470. The first and second electrodes 470 and 480, and the organic light emitting layer 471 constitute a diode E.

The organic light emitting layer 471 is formed in a single layer or a multiple layer between the first electrode 470 and the second electrode 480.

In the case where the organic light emitting layer 471 is formed in a multiple layer, a hole injection layer (HIL) can be formed to be adjacent to the first electrode 470, and an EIL can be formed to be adjacent to the second electrode 480.

For example, an HIL 471a, an HTL 471b, an EMI 471c, an ETL 471d, and an EIL 471e are sequentially stacked on the first electrode 470. Also, the second electrode 480 is formed on the organic light emitting layer 471.

Here, the first electrode 470 serves as an anode, and is formed of metal having a large work function, including ITO and IZO.

The second electrode 480 serves as a transparent cathode, and is formed of metal having a small work function such as Al.

The organic light emitting layer 471 emits light through the following principle, in which a hole that has passed through the HTL 471b and an electron that has passed through the ETL 471d recombine in the EML 471c to emit light corresponding to a lowered energy difference. Exiton is generated during this recombination, and light is emitted due to the exiton.

Since the first electrode 470 is disposed on the driving device Td, and an auxiliary electrode 462a connected to the second source electrode 452 is formed between a portion of the second semiconductor layer 458 that corresponds to the driving device Td and the first electrode 470, the auxiliary electrode 462a having a source potential dominantly acts on the second semiconductor layer 458.

Since the second source electrode 452 is connected to the ground line, the source potential is almost 0 V.

Since the source potential does not change much even when the driving device Td is turned on, the auxiliary electrode 462a is formed under the first electrode 470 to block an influence of the first electrode 470 on the channel of the second semiconductor layer 458.

That is, since the second source electrode 452 is connected to the auxiliary electrode 462a, a source potential is formed on the second semiconductor layer 458 to block an external field generated by the first electrode 470.

Even when the driving device Td is turned on, the source potential does not change much because a current flows through the ground line 462. Accordingly, the source potential has a small influence on the channel even when it is formed on the second semiconductor layer 458.

Therefore, a field effect of the channel of the second semiconductor layer 458 due to the first electrode 470 can be blocked by the ground line 462 and the auxiliary electrode 462a connected to the second source electrode 452.

Figure 11:
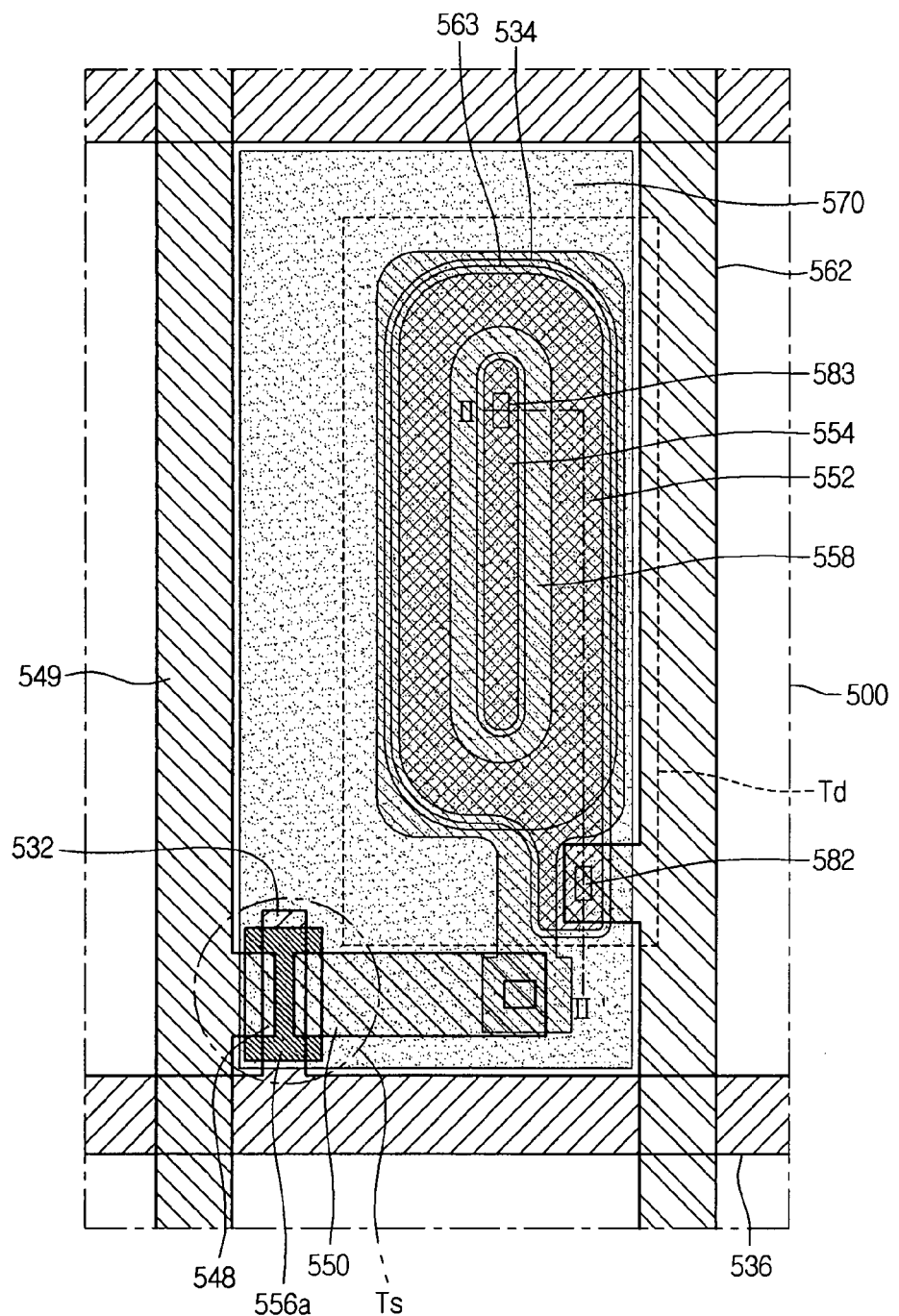
FIG. 11 is a plan view of an OLED according to a fourth embodiment of the present invention.
Figure 12:
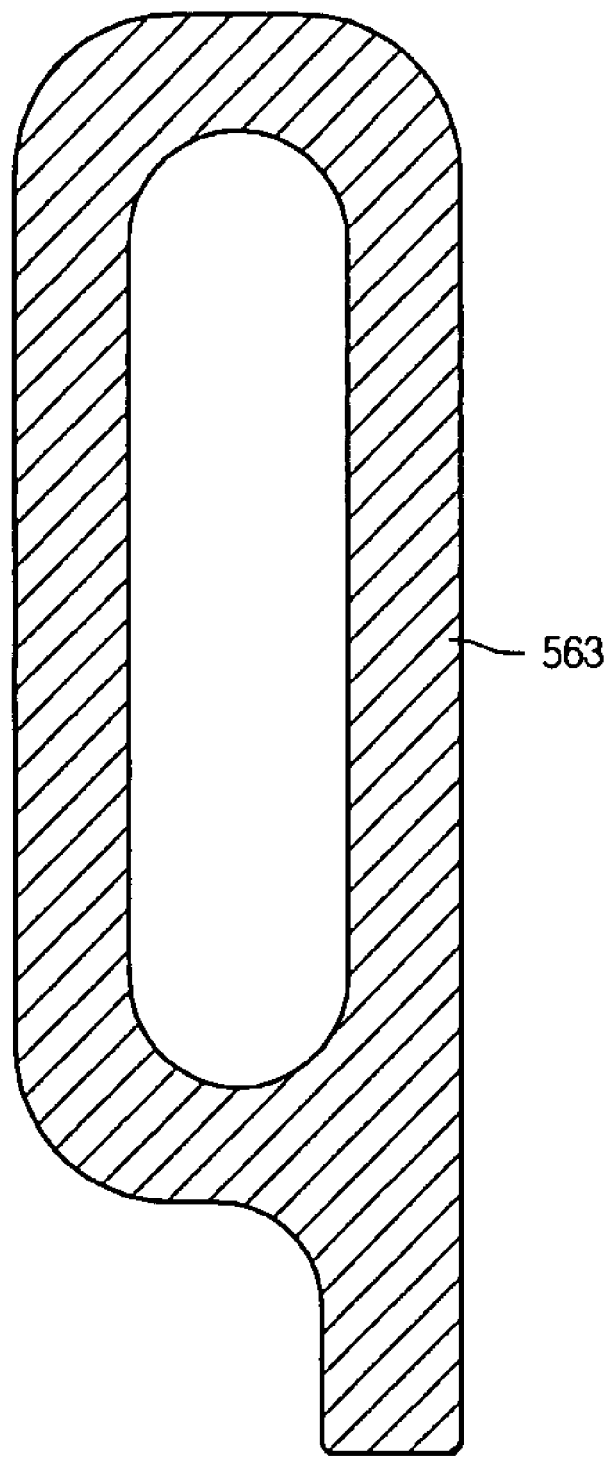
FIG. 12 is plan views illustrating an auxiliary electrode of FIG. 11.

FIG. 11 is a plan view of an OLED according to a fourth embodiment of the present invention, and FIG. 12 is a plan views illustrating an auxiliary electrode according to embodiments of the present invention.

Figure 13:
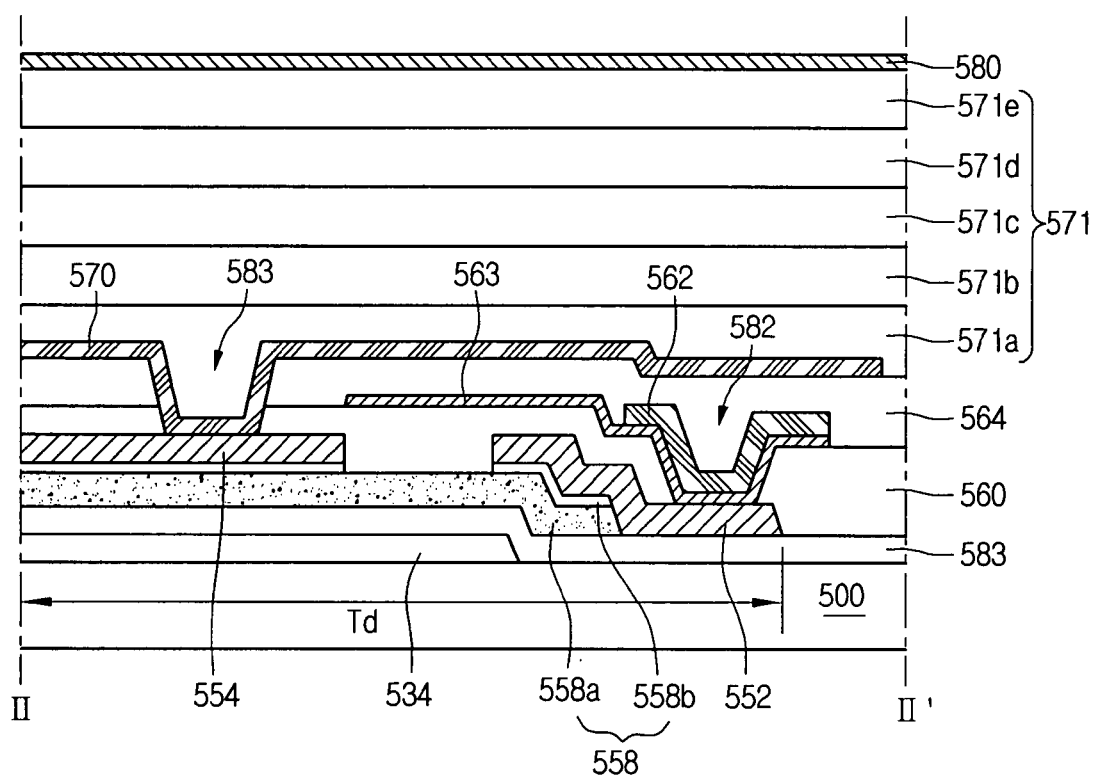
FIG. 13 is a cross-sectional view taken along a line II-II' of FIG. 11.

Also, FIG. 13 is a cross-sectional view taken along a line II-II' of FIG. 11.

Here, a driving device Td different from the above-described first embodiment will be described in detail, but other portions described with reference to the first embodiment will be omitted. The driving device Td (illustrated in FIGS. 11 and 13) includes a first gate electrode 534, a first source electrode 552, a first drain electrode 554, and a first semiconductor layer 558 formed of amorphous silicon. A gate insulator 538 overlies the gate first gate electrode 534 and separates the gate electrode from the first semiconductor layer 558.

Referring to FIGS. 11 and 13, a second source electrode 552 of the driving device is formed in a ring shape. A second drain electrode 554 is separated from the second source electrode 552 within the second source electrode 552.

A second semiconductor layer 558 is exposed between the second source electrode 552 and the second drain electrode 554 to form a channel. The first electrode 570 is connected to the second drain electrode 554 through a contact opening 583 in first and second passivation layers 560 and 564.

An auxiliary electrode 563 electrically connected to the second source electrode 552 and the ground line 562 covers the channel.

Referring to FIG. 12, the auxiliary electrode 563 is open to correspond to the second drain electrode 554, and has a ring shape corresponding to the channel, as shown in FIG. 13. The auxiliary electrode 563 may be extended longer or shorter than the channel upon need.

In this case, the auxiliary electrode 563 does not overlap the second drain electrode 554.

Therefore, the auxiliary electrode 563 is formed under a first electrode 570 to not only block an influence of the first electrode 570 on the channel of the second semiconductor layer 558, but also cover only the second semiconductor layer 558 and does not overlap the second drain electrode 554. Accordingly, a short circuit between the auxiliary electrode 563 and the second drain electrode 554 can be prevented.

In the embodiments of the present invention, a TFT using an n-type semiconductor layer can be used, and a TFT using a p-type semiconductor layer can be used.

The present invention can prevent an output current saturation characteristic from being deteriorated and improve reliability and life of a driving device by a ground potential on the driving device in an OLED.

Also, the present invention improves image quality by preventing brightness reduction and non-uniformity caused by a reducing current due to deterioration of an organic light emitting layer.

It will be apparent to those skilled in the art that various modifications and variations can be made in the present invention. Thus, it is intended that the present invention covers the modifications and variations of this invention provided they come within the scope of the appended claims and their equivalents.

What is claimed is:

1. An organic light emitting device comprising:
   a driver transistor including a channel region and source and drain electrodes;
   an insulating layer on the driver transistor and having a contact hole;
   a ground line electrically coupled to the source electrode of the driver transistor;
   a light emitting diode including a first electrode electrically coupled to the drain electrode of the driver transistor through the contact hole and overlying the driver transistor, an organic light emitting layer overlying the first electrode, and a second electrode overlying the organic light emitting layer; and
   an auxiliary electrode formed from the ground line and electrically coupled to the source electrode of the driver transistor.

2. The organic light emitting device of claim 1, wherein the auxiliary electrode overlies the source electrode and at least a portion of the channel region and is separated therefrom by an insulating layer, and
   wherein the auxiliary electrode is separated from the first electrode, is formed in the same layer as the ground line, and is formed between the first electrode and the channel region of the driver transistor.

3. The organic light emitting device of claim 1, wherein the auxiliary electrode overlies the source electrode and extends over the channel region to a point in proximity to the drain electrode and is separated therefrom by the insulating layer.

4. The organic light emitting device of claim 3, wherein the auxiliary electrode is separated from the channel region and the drain electrode by the insulating layer, and wherein auxiliary electrode encircles a perimeter of at least a portion of the channel region.

5. The organic light emitting device of claim 1, wherein the driver transistor is a p-type transistor.

6. The organic light emitting device of claim 1, wherein the auxiliary electrode is integral with the ground line, and
wherein the auxiliary electrode extends onto the channel region of the driver transistor from the ground line to cover at least the channel region.

7. The organic light emitting device of claim 1 further comprising:
a switching transistor electrically coupled to the driver transistor; and
a power line electrically coupled to the second electrode of the light emitting diode.

8. The organic light emitting device of claim 1, wherein the auxiliary electrode block a field effect of the channel region of the driver transistor.

9. An organic light emitting device comprising:
a driving transistor including a channel region, a source electrode and a drain electrode;
an insulating layer on the driver transistor and having a contact hole;
a ground line electrically coupled to the source electrode of the driver transistor;
a light emitting diode including a first electrode electrically coupled to the drain electrode through the contact hole and overlying the driving transistor, an organic light emitting layer overlying the first electrode, and a second electrode overlying the organic light emitting layer; and
an auxiliary electrode formed to contact one upper surface of the source electrode and the ground line.

10. The organic light emitting device of claim 9, wherein the channel region has a ring shape and the auxiliary electrode encircles at least a portion of the channel region.

11. The organic light emitting device of claim 9, wherein a portion of the auxiliary electrode overlaps with a portion of the ground line,
wherein the auxiliary electrode is separated from the first electrode, and is formed between the first electrode and the channel region of the driver transistor, and
wherein the auxiliary electrode extends onto the channel region of the driver transistor from the source electrode to cover at least the channel region.

12. The organic light emitting device of claim 9 further comprising:
a switching transistor electrically coupled to the driver transistor; and
a power line electrically coupled to the second electrode of the light emitting diode.

13. The organic light emitting device of claim 9, wherein the auxiliary electrode comprises at least one selected from the group consisting of Al, an aluminum alloy, W, Cu, Mo, and Ti.

14. The organic light emitting device of claim 9, wherein the auxiliary electrode comprises at least one selected from the group consisting of indium tin oxide and indium zinc oxide.

15. The organic light emitting device of claim 1, wherein the auxiliary electrode covers an entire portion of the channel region.

16. The organic light emitting device of claim 1, wherein the first electrode overlaps the driver transistor with the insulating layer therebetween.

* * * * *